(12) United States Patent
Jhang et al.

(10) Patent No.: US 10,714,494 B2
(45) Date of Patent: Jul. 14, 2020

(54) 3D MEMORY DEVICE WITH SILICON NITRIDE AND BUFFER OXIDE LAYERS AND METHOD OF MANUFACTURING THE SAME

(71) Applicant: MACRONIX International Co., Ltd., Hsinchu (TW)

(72) Inventors: Pei-Ci Jhang, New Taipei (TW); Chi-Pin Lu, Hsinchu County (TW)

(73) Assignee: MACRONIX INTERNATIONAL CO., LTD., Hisnchu (TW)

( * ) Notice: Subject to any disclaimer, the term of this patent is extended or adjusted under 35 U.S.C. 154(b) by 0 days.

(21) Appl. No.: 15/821,832

(22) Filed: Nov. 23, 2017

(65) Prior Publication Data

US 2019/0157290 A1  May 23, 2019

(51) Int. Cl.
| | | |
|---|---|---|
| *H01L 27/11582* | (2017.01) | |
| *H01L 21/02* | (2006.01) | |
| *H01L 21/28* | (2006.01) | |
| *H01L 27/1157* | (2017.01) | |

(52) U.S. Cl.
CPC ...... *H01L 27/11582* (2013.01); *H01L 21/022* (2013.01); *H01L 21/0217* (2013.01); *H01L 21/02178* (2013.01); *H01L 21/02356* (2013.01); *H01L 27/1157* (2013.01); *H01L 29/40117* (2019.08)

(58) Field of Classification Search
None
See application file for complete search history.

(56) References Cited

U.S. PATENT DOCUMENTS

| | | | |
|---|---|---|---|
| 9,184,175 B2 | 11/2015 | Dennison et al. | |
| 9,515,079 B2* | 12/2016 | Koka | H01L 29/7883 |
| 9,673,216 B1 | 6/2017 | Baraskar et al. | |
| 9,685,454 B2 | 6/2017 | Rabkin et al. | |
| 2011/0275197 A1 | 11/2011 | Park et al. | |
| 2014/0054676 A1* | 2/2014 | Nam | H01L 29/7926 257/324 |
| 2014/0264532 A1 | 9/2014 | Dennison et al. | |
| 2016/0149004 A1 | 5/2016 | Rabkin et al. | |
| 2016/0172366 A1* | 6/2016 | Koka | H01L 29/7883 257/314 |

(Continued)

FOREIGN PATENT DOCUMENTS

| | | |
|---|---|---|
| TW | 201421650 | 6/2014 |
| TW | 201628194 | 8/2016 |
| TW | 201717360 | 5/2017 |

OTHER PUBLICATIONS

"Office Action of Taiwan Counterpart Application," dated Mar. 23, 2018, p. 1-p. 6, in which the listed references were cited.

*Primary Examiner* — Lex H Malsawma
(74) *Attorney, Agent, or Firm* — J.C. Patents

(57) ABSTRACT

Provided is a memory device including a substrate, a stack layer, a channel structure, a charge storage structure, a silicon nitride layer, and a buffer oxide layer. The stack layer is disposed over the substrate. The stack layer includes a plurality of dielectric layers and a plurality of conductive layers stacked alternately. The channel structure penetrates through the stack layer. The charge storage structure surrounds a sidewall of the channel structure. The silicon nitride layer surrounds the conductive layers. The buffer oxide layer is disposed between the conductive layers and the silicon nitride layer.

19 Claims, 11 Drawing Sheets

(56) References Cited

U.S. PATENT DOCUMENTS

2016/0343657 A1* 11/2016 Sawa ................. H01L 27/11582
2017/0062465 A1*  3/2017 Yamashita ........ H01L 27/11582
2017/0069647 A1*  3/2017 Ohashi ............. H01L 27/11568
2017/0125436 A1*  5/2017 Sharangpani ..... H01L 27/11582
2018/0076024 A1*  3/2018 Park ........................ C07F 5/062

* cited by examiner ical diagrams illustrating a manufacturing process of a memory device according to a first embodiment of the invention.

3D MEMORY DEVICE WITH SILICON NITRIDE AND BUFFER OXIDE LAYERS AND METHOD OF MANUFACTURING THE SAME

BACKGROUND OF THE INVENTION

Field of the Invention

The invention relates to a semiconductor device and a manufacturing method thereof, and in particular, to a memory device and a manufacturing method thereof.

Description of Related Art

With the continuous development of science and technology, the demands for greater storage capacity also increase as electronic devices continue to improve. To satisfy the demands for high storage density, memory devices become smaller in size and have higher integrity. Therefore, the form of memory devices has developed from 2D memory devices having a planar gate structure to 3D memory devices having a vertical channel (VC) structure.

However, as integrity of 3D memory devices increases, a high aspect ratio and a complex film stack may result in wafer bow or wafer distortion. Accordingly, how to develop a memory device of high integrity and a manufacturing method thereof to prevent wafer bow or wafer distortion has become one of the major issues in the art.

SUMMARY OF THE INVENTION

The invention provides a memory device and a manufacturing method thereof that are capable of preventing the issue of wafer bow or wafer distortion.

The invention provides a memory device including a substrate, a stack layer, a channel structure, a charge storage structure, a silicon nitride layer, and a buffer oxide layer. The stack layer is disposed over the substrate. The stack layer includes a plurality of dielectric layers and a plurality of conductive layers stacked alternately. The channel structure penetrates through the stack layer. The charge storage structure surrounds a sidewall of the channel structure. The silicon nitride layer surrounds the conductive layers. The buffer oxide layer is disposed between the conductive layers and the silicon nitride layer.

The invention provides a method of manufacturing a memory device including the following steps: forming a stack layer on a substrate, wherein the stack layer includes a plurality of first materials and a plurality of second materials stacked alternately; forming a plurality of openings in the stack layer, the openings exposing a portion of the substrate; forming a charge storage structure in each of the openings; forming a channel structure in each of the openings, such that the charge storage structure surrounds a sidewall of the channel structure; forming a slit in the stack layer between two adjacent channel structures, the slit exposing another portion of the substrate; performing an etching process to remove the second materials to form a plurality of gaps between the first materials; forming a silicon nitride layer on the substrate, the silicon nitride layer conformally covering a surface of the gaps; forming a buffer oxide layer on the silicon nitride layer; and forming conductive layers in the gaps, such that the buffer oxide layer is located between the conductive layers and the silicon nitride layer.

In light of the above, in the memory device of the invention, the buffer oxide layer is formed on the silicon nitride layer after the silicon nitride layer is formed. The silicon nitride layer is able to improve the crystallization quality of the buffer oxide layer to lower an annealing temperature of the post-deposition annealing (PDA) process and further prevent the issue of wafer bow or wafer distortion.

To provide a further understanding of the aforementioned and other features and advantages of the disclosure, exemplary embodiments, together with the reference drawings, are described in detail below.

DESCRIPTION OF THE EMBODIMENTS

FIG. 1A to FIG. 1F are cross-sectional schematic diagrams illustrating a manufacturing process of a memory device according to a first embodiment of the invention.

Figure 1A:
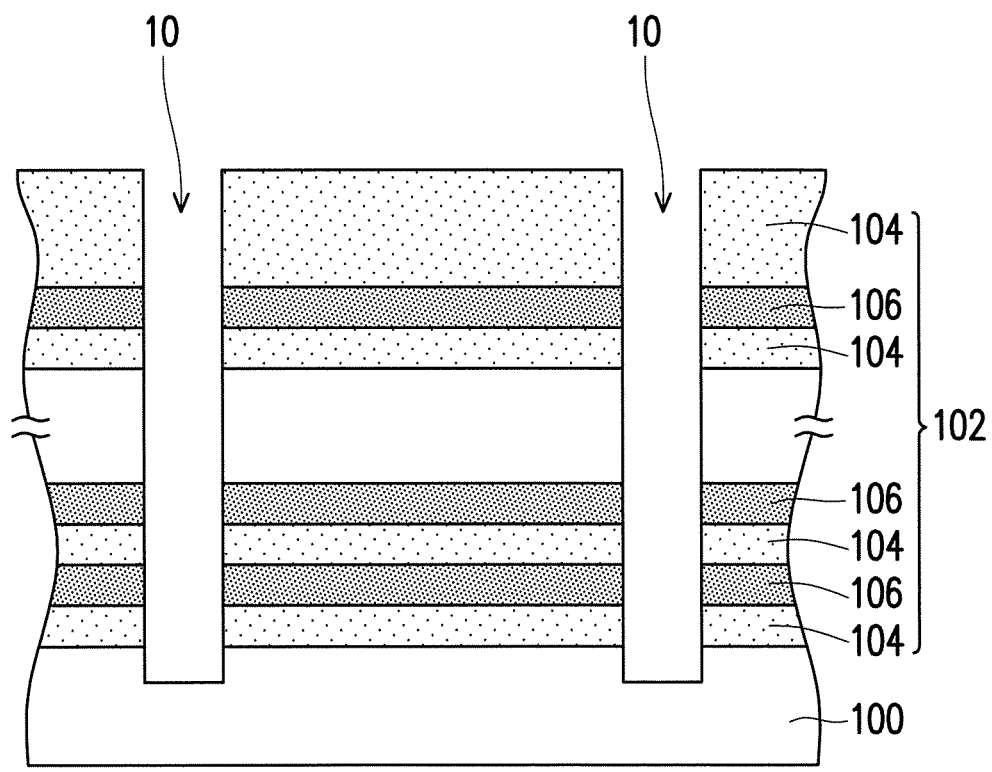
FIG. 1A to FIG. 1H are cross-sectional schematic diagrams illustrating a manufacturing process of a memory device according to a first embodiment of the invention.

Referring to FIG. 1A, a substrate 100 is provided. The substrate 100 includes a semiconductor substrate such as a silicon substrate. A stack layer 102 is formed on the substrate 100. Specifically, the stack layer 102 includes a plurality of first materials 104 and a plurality of second materials 106 stacked alternately. In an embodiment, the first materials 104 and the second materials 106 may be different dielectric materials. For example, the first materials 104 may be silicon oxide, and the second materials 106 may be silicon nitride. However, the invention is not limited hereto. In other embodiments, the first materials 104 may be silicon oxide, and the second materials 106 may be polycrystalline silicon. In an embodiment, a number of the first materials 104 and a number of the second materials 106 may be 8 layers, 16 layers, 32 layers, 39 layers, 72 layers, or more layers.

Then, a plurality of openings 10 are formed in the stack layer 102. The openings 10 penetrate through the stack layer 102 to expose a portion of the substrate 100. In an embodiment, a method of forming the openings 10 includes performing a patterning process on the stack layer 102. To completely remove a lowermost layer in the stack layer 102, a portion of the substrate 100 is removed when the patterning process is performed. In this case, as shown in FIG. 1A, a bottom surface of the openings 10 may be lower than a top surface of the substrate 100.

Figure 1B:
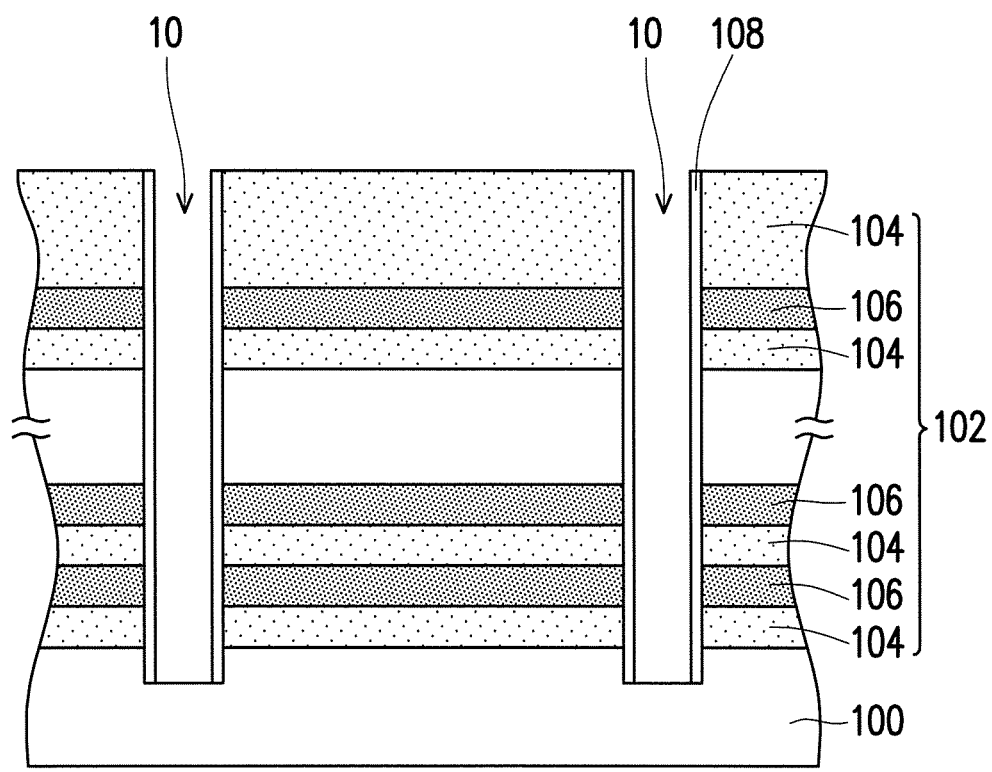

Referring to FIG. 1B, a charge storage structure 108 is formed in the openings 10. Specifically, a charge storage material (not illustrated) is formed on the substrate 100. The charge storage material conformally covers the bottom surface and a sidewall of the openings 10 and a top surface of the stack layer 102. Then, an etching process is performed to remove the charge storage material on the bottom surface of the openings 10 and the top surface of the stack layer 102, such that the charge storage structure 108 is formed on the sidewall of the openings 10 in a form similar to a spacer wall. In an embodiment, the charge storage structure 108 may be a composite layer of oxide layer/nitride layer/oxide layer (ONO). In an embodiment, the etching process includes an anisotropic etching process, e.g., a reactive-ion etching (RIE) process.

Figure 1C:
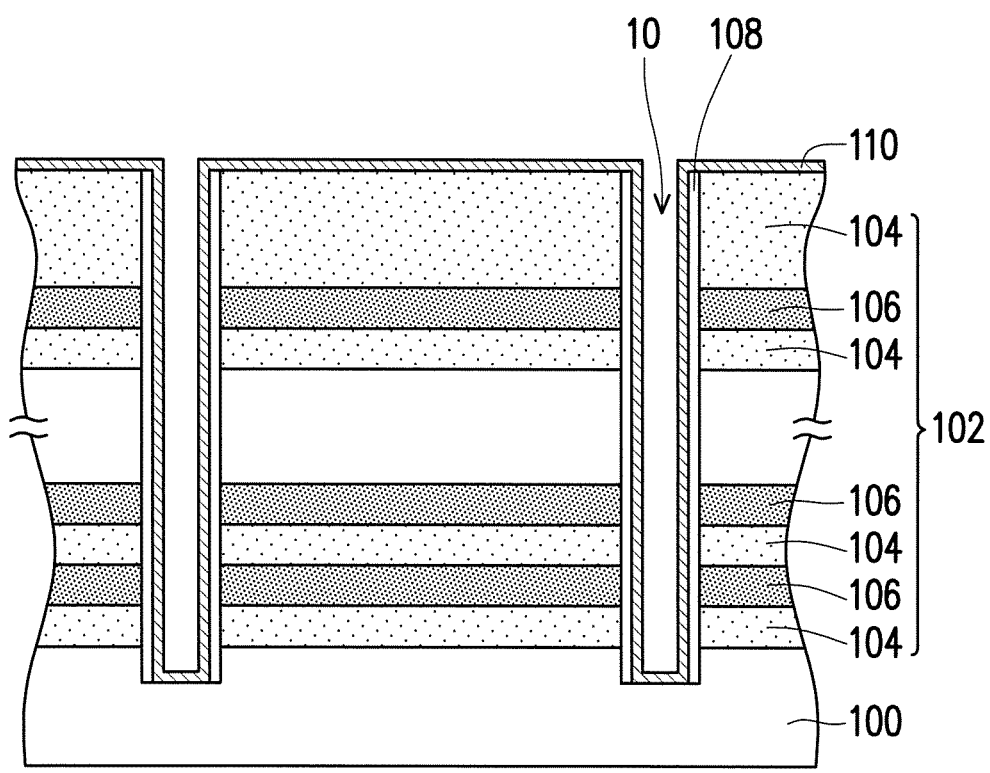

Referring to FIG. 1C, a first channel material 110 is formed on the substrate 100. The first channel material 110 conformally covers the bottom surface of the openings 10, a surface of the charge storage structure 108, and the top surface of the stack layer 102. In an embodiment, the first channel material 110 includes a semiconductor material such as polycrystalline silicon. The first channel material 110 is formed by, for example, a chemical vapor deposition (CVD) process.

Figure 1D:
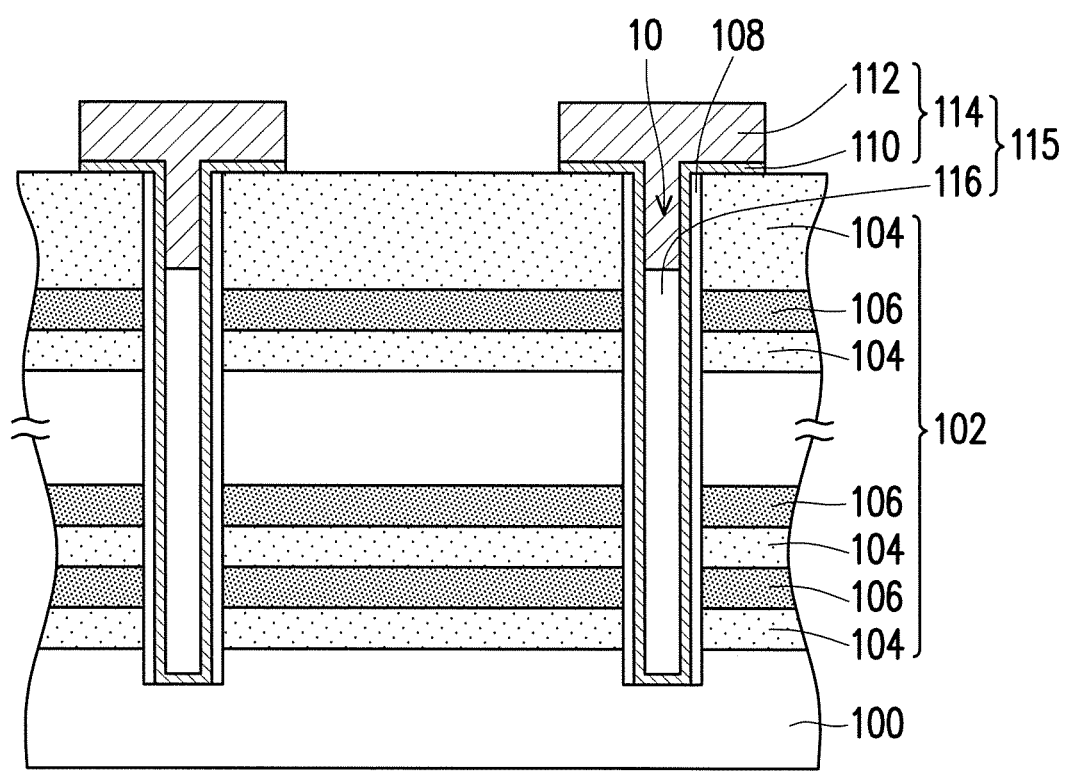

Referring to FIG. 1C and FIG. 1D, a dielectric pillar 116 is formed in each of the openings 10. The dielectric pillar 116 is filled in the opening 10, and a top surface of the dielectric pillar 116 is lower than the top surface of the stack layer 102. In other words, the dielectric pillar 116 does not fully fill the opening 10. In an embodiment, a material of the dielectric pillar 116 includes spin-on dielectrics (SOD). Then, the second channel material 112 is formed on the dielectric pillar 116 to cover the top surface of the dielectric pillar 116 and extend to cover the top surface of the stack layer 102. Afterwards, the second channel material 112 and the first channel material 110 are patterned to form a channel structure 115. As shown in FIG. 1D, the channel structure 115 includes the dielectric pillar 116 and a channel layer 114 formed by the first channel material 110 and the second channel material 112, wherein the channel layer 114 encapsulates the dielectric pillar 116. The charge storage structure 108 surrounds a sidewall of the channel structure 115. In an embodiment, the second channel material 112 includes a semiconductor material such as polycrystalline silicon. The second channel material 112 is formed by, for example, a chemical vapor deposition (CVD) process.

Figure 1E:
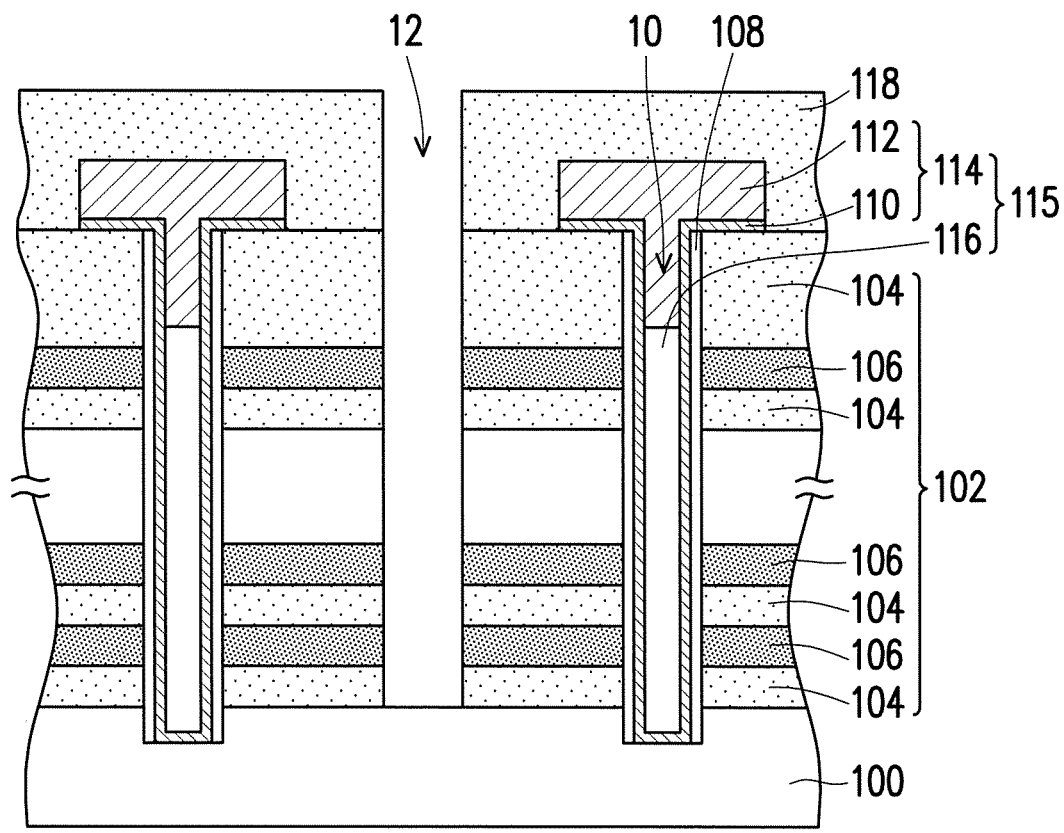

Referring to FIG. 1D and FIG. 1E, a dielectric layer 118 is formed on the substrate 100 to cover the top surface of the stack layer 102 and a surface of the channel structure 115. In an embodiment, the dielectric layer 118 includes but is not limited to silicon oxide, and is formed by, for example, a chemical vapor deposition (CVD) process. After the dielectric layer 118 is formed, a slit 12 is formed in the stack layer 102 between two adjacent channel structures 115. The slit 12 penetrates through the dielectric layer 118 and the stack layer 102 and exposes a portion of the substrate 100. Although a bottom surface of the slit 12 as shown in FIG. 1E is coplanar with the bottom surface of the lowermost layer in the stack layer 102, to completely remove the lowermost layer in the stack layer 102, a portion of the substrate 100 is removed when the slit 12 is formed. In this case, the bottom surface of the slit 12 may be lower than the top surface of the substrate 100.

Figure 1F:
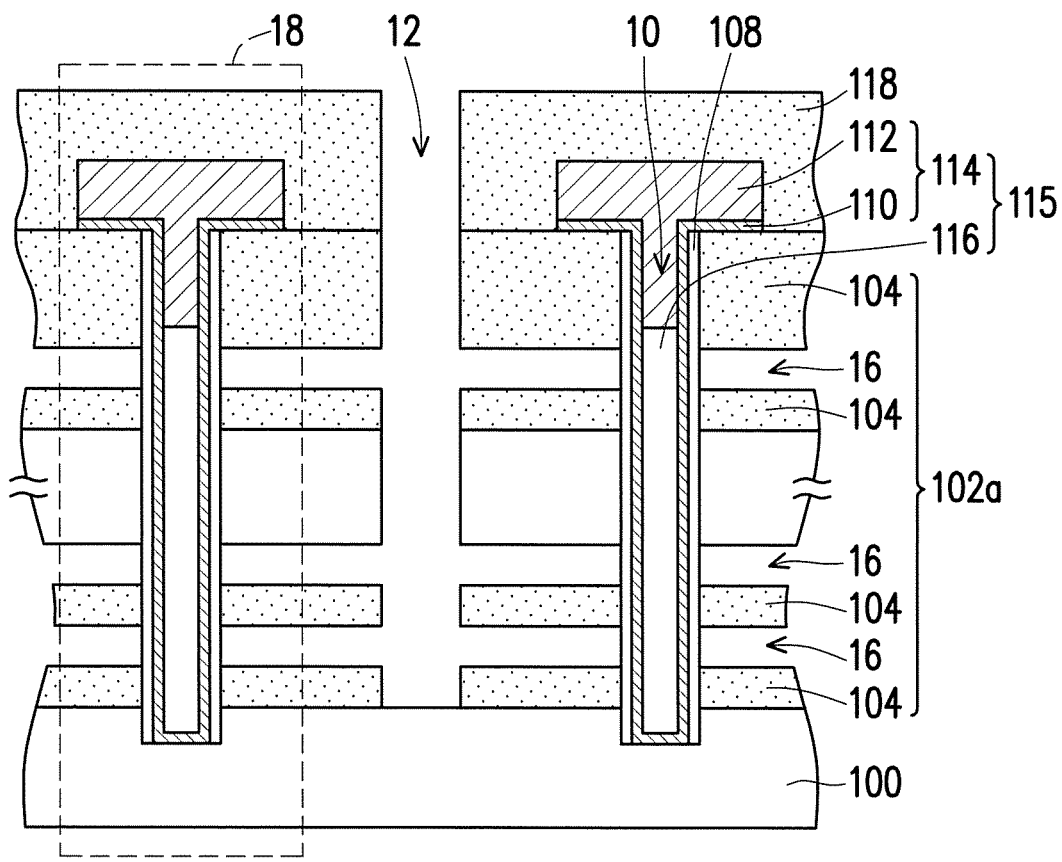

Referring to FIG. 1E and FIG. 1F, an etching process is performed to remove the second materials 106 to form a plurality of gaps 16 between the first materials 104. The gaps 16 transversely expose a portion of the sidewall of the charge storage structure 108. In other words, the gaps 16 are defined by the first materials 104 and the charge storage structure 108. In an embodiment, the etching process may be a wet etching process. For example, when the second materials 106 are silicon nitride, the etching process may use an etching solution containing phosphoric acid and pour the etching solution into the slit 12 to thereby remove the second materials 106. Since the etching solution has high etching selectivity for the second materials 106, the second materials 106 may be completely removed, and the first materials 104 are not removed or are merely slightly removed.

Figure 1G:
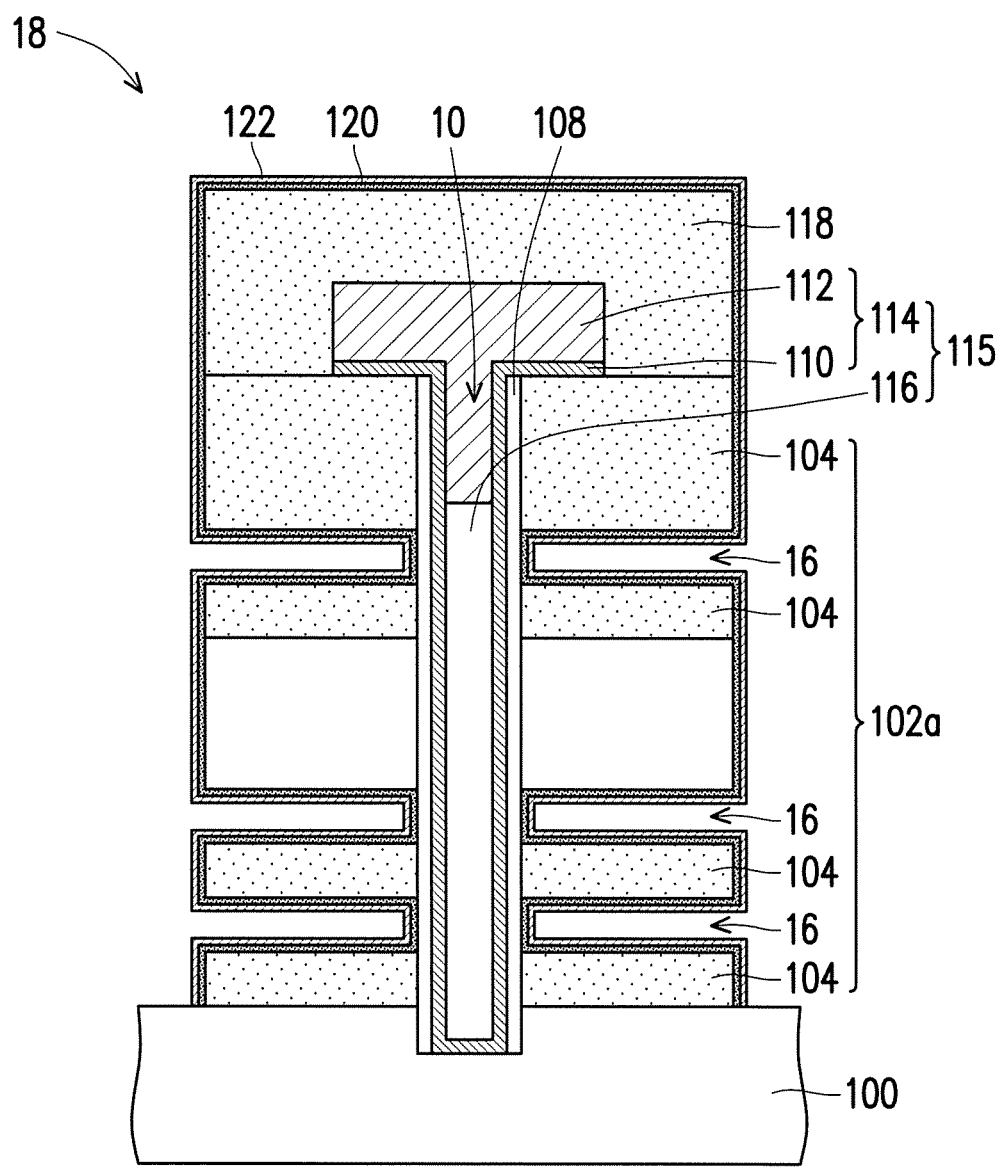
Figure 1H:
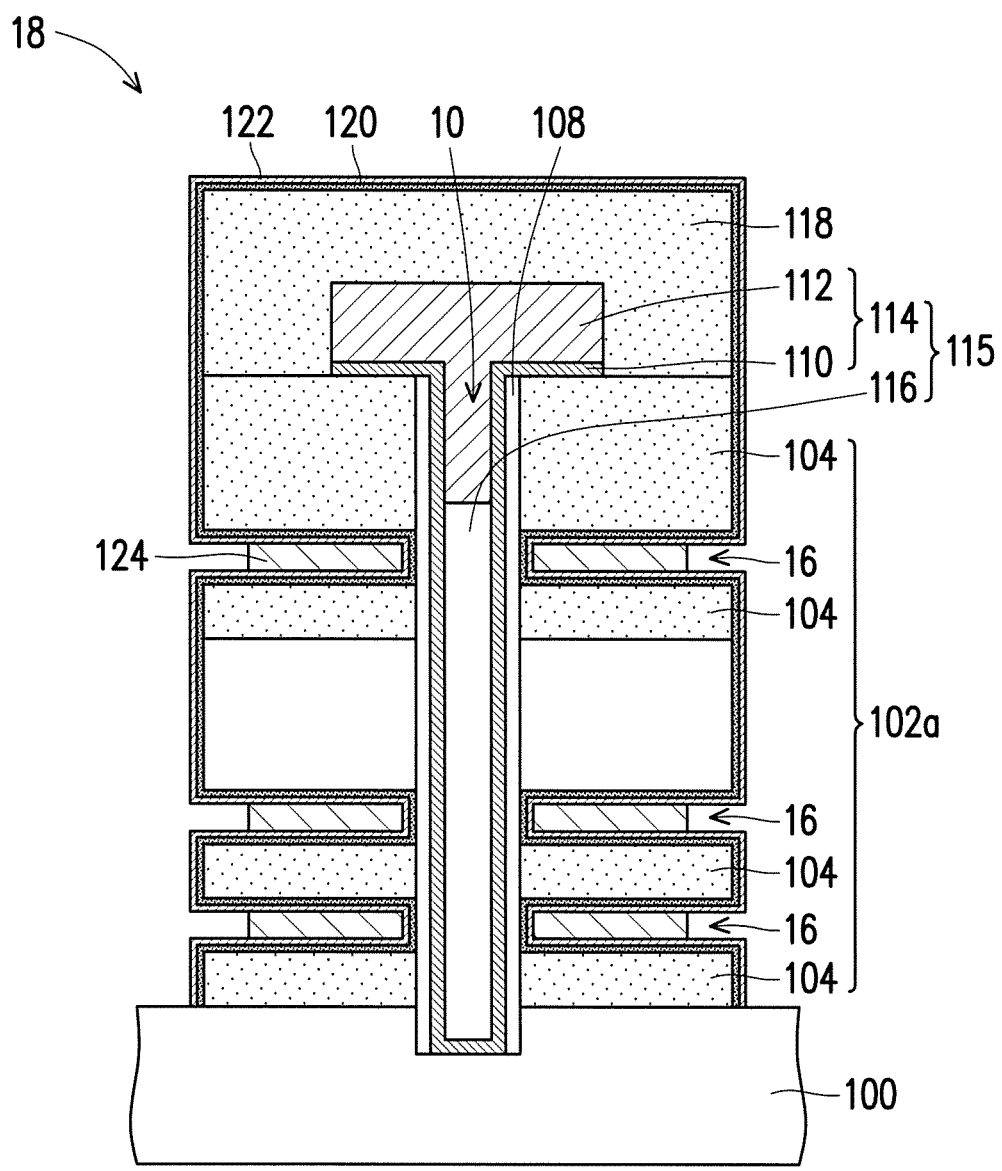

For clarity, FIG. 1G to FIG. 1H illustrate enlarged views of a portion 18 of FIG. 1F.

Referring to FIG. 1G, a silicon nitride layer 120 is formed on the substrate 100. The silicon nitride layer 120 may be a continuous layer and conformally covers a surface of the gaps 16 and extends to cover the sidewall of the first materials 104 and a surface of the dielectric layer 118. In an embodiment, a method of forming the silicon nitride layer 120 includes an atomic layer deposition (ALD) process or a plasma nitridation process. Taking the plasma nitridation process as an example, since the surface of the first materials 104 and the portion of the sidewall of the charge storage structure 108 exposed by the gaps 16 are both silicon oxide, the plasma nitridation process may transform silicon oxide into silicon nitride through nitriding. In other embodiments, the plasma nitridation process may also transform silicon oxide into silicon oxynitride through nitriding. That is, the silicon nitride layer 120 also has silicon oxynitride within. In an embodiment, a thickness of the silicon nitride layer 120 ranges from 20 Å (angstrom) to 50 Å. In alternative embodiments, the thickness of the silicon nitride layer 120 ranges from 20 Å to 30 Å.

Next, a buffer oxide layer 122 is formed on the silicon nitride layer 120. The buffer oxide layer 122 conformally covers a surface of the silicon nitride layer 120. In an embodiment, the buffer oxide layer 122 includes a high-dielectric constant material of which a dielectric constant is higher than that of silicon oxide or 4. The high-dielectric constant material is, for example, aluminum oxide, hafnium oxide, or a combination thereof. The buffer oxide layer 122 may be formed by an atomic layer deposition (ALD) process.

Afterwards, an annealing process is performed to enhance a crystalline state of the buffer oxide layer 122. In an embodiment, the annealing process may be a post-deposition annealing process, wherein an annealing temperature is lower than 1,000° C. In alternative embodiments, the annealing temperature may range from 900° C. to 1050° C. It shall be noted that compared to a silicon oxide layer, the silicon nitride layer 120 improves crystallization quality of the buffer oxide layer 122 to lower the annealing temperature of the post-deposition annealing process and further prevent the issue of wafer bow or wafer distortion.

Referring to FIG. 1G and FIG. 1H, conductive layers 124 are formed in the gaps 16, such that the buffer oxide layer 122 is located between the conductive layers 124 and the silicon nitride layer 120. As shown in FIG. 1H, the silicon nitride layer 120 and the buffer oxide layer 122 surround the conductive layers 124 and conformally fill in a space between the conductive layers 124 and the first materials 104. In an embodiment, a method of forming the conductive layers 124 includes forming a conductive material (not illustrated) on the substrate 100. The conductive material fully fills in the gaps 16 and covers the sidewall of the stack layer 102a and the dielectric layer 118. Then, an etching process is performed to remove the conductive material on the sidewall of the stack layer 102a and the dielectric layer 118. To completely remove the conductive material on the sidewall of the stack layer 102a and the dielectric layer 118, a portion of the conductive material in the gaps 16 is removed when the etching process is performed. In this case, as shown in FIG. 1H, a sidewall of the formed conductive layers 124 is indented from the sidewall of the first materials 104. In an embodiment, a material of the conductive layers 124 includes metal, barrier metal, polycrystalline silicon, or a combination thereof, and the conductive layers 124 may be formed by a chemical vapor deposition (CVD) process or a physical vapor deposition (PVD) process.

Referring to FIG. 1H, a memory device 1 of the present embodiment includes the substrate 100, the stack layer 102*a*, the channel structure 115, the charge storage structure 108, the silicon nitride layer 120, and the buffer oxide layer 122. The stack layer 102*a* is disposed over the substrate 100. The stack layer 102*a* includes the plurality of first materials (which are dielectric layers, for example) 104 and the plurality of conductive layers 124 stacked alternately. The channel structure 115 penetrates through the stack layer 102*a*. The charge storage structure 108 surrounds the sidewall of the channel structure 115. The silicon nitride layer 120 surrounds the conductive layers 124. The buffer oxide layer 122 is disposed between the conductive layers 124 and the silicon nitride layer 120. In an embodiment, a memory device 1 may be a gate-all-around (GAA) memory device. In other words, the conductive layers 124 may be seen as gates or word lines, and the channel structure 115 may be seen as a bit line. In alternative embodiments, the memory device 1 may be a NAND memory device.

Figure 2:
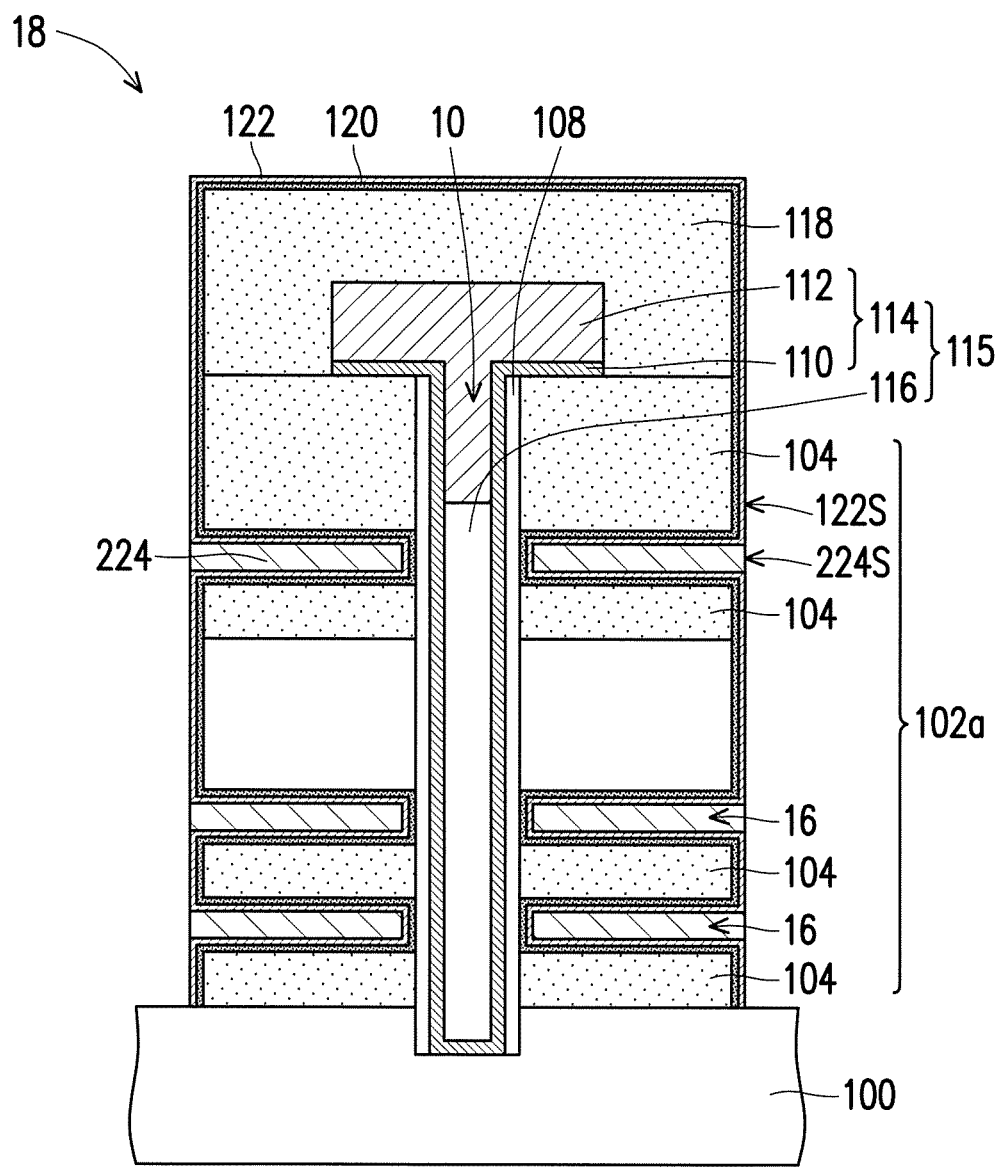
FIG. 2 is a cross-sectional schematic diagram illustrating a memory device according to a second embodiment of the invention.

FIG. 2 is a cross-sectional schematic diagram illustrating a memory device according to a second embodiment of the invention.

Referring to FIG. 2, a memory device 2 of the second embodiment is similar to the memory device 1 of the first embodiment. The difference between the two lies in that a sidewall of conductive layers 224 of the memory device 2 is coplanar with a sidewall of the buffer oxide layer 122. In some alternative embodiments, the sidewall of conductive layers 224 may be coplanar with a sidewall of the first materials (which are dielectric layers, for example) 104.

Figure 3:
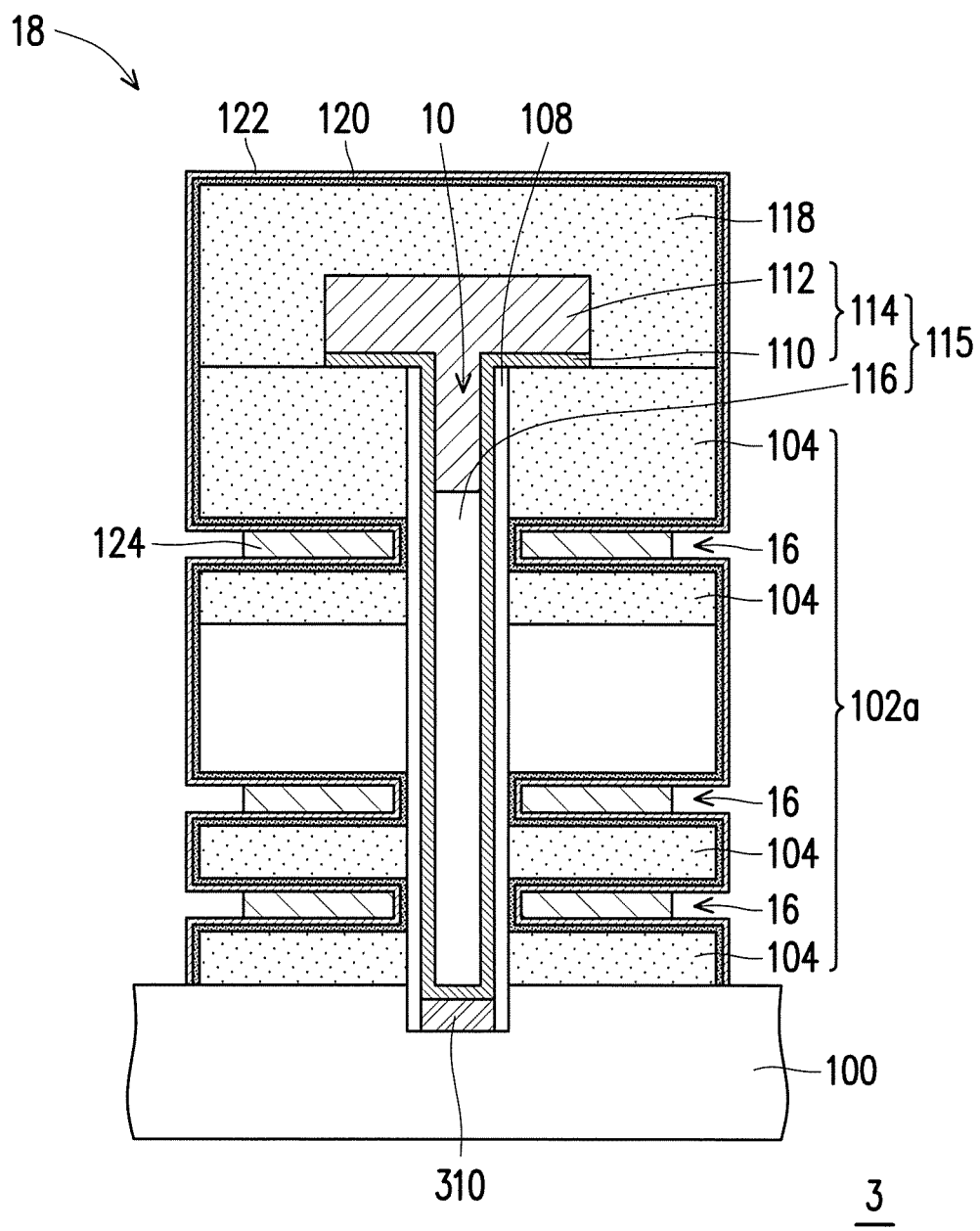
FIG. 3 is a cross-sectional schematic diagram illustrating a memory device according to a third embodiment of the invention.

FIG. 3 is a cross-sectional schematic diagram illustrating a memory device according to a third embodiment of the invention.

Referring to FIG. 3, a memory device 3 of the third embodiment is similar to the memory device 1 of the first embodiment. The difference between the two lies in that the memory device 3 further includes an epilayer 310 disposed between the channel structure 115 and the substrate 100. A method of forming the epilayer 310 may include epitaxially growing the epilayer 310 on the substrate 100 in the opening 10 after the charge storage structure 108 is formed (as shown in FIG. 1B). In an embodiment, the epilayer 310 may be epitaxial silicon. The epilayer 310 may increase the conductive area to decrease the resistance.

Figure 4:
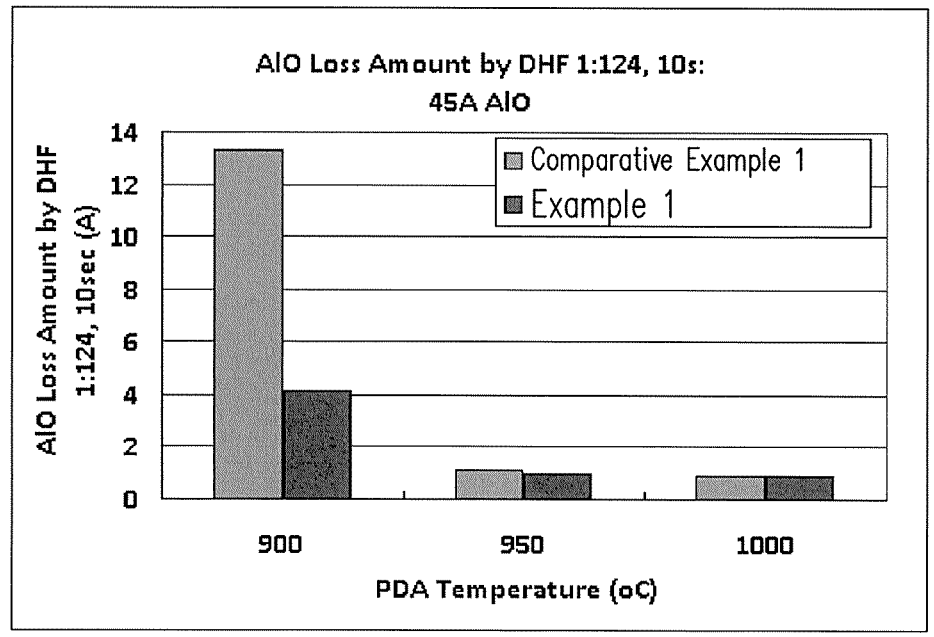
FIG. 4 is a diagram illustrating a relationship between an aluminum oxide removal amount and a temperature in Example 1 and Comparative Example 1.
Figure 5:
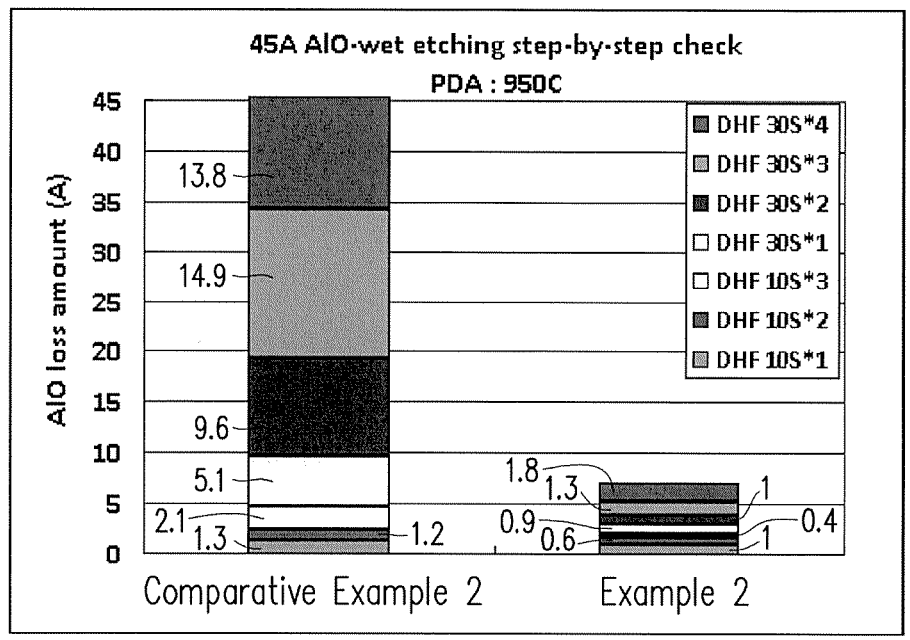
FIG. 5 is a diagram illustrating a relationship between the aluminum oxide removal amount and time in Example 2 and Comparative Example 2 at a fixed temperature.

FIG. 4 is a diagram illustrating a relationship between an aluminum oxide removal amount and a temperature in Example 1 and Comparative Example 1. FIG. 5 is a diagram illustrating a relationship between the aluminum oxide removal amount and time in Example 2 and Comparative Example 2 at a fixed temperature.

Example 1

In Example 1, a sample is provided. The sample includes a silicon nitride layer having a thickness of 30 Å formed on a silicon substrate and an aluminum oxide layer having a thickness of 45 Å formed on the silicon nitride layer. Then, an annealing process is performed on the sample. Annealing temperatures of the annealing process are respectively 900° C., 950° C., and 1,000° C. An annealing time of the annealing process is 30 minutes. Afterwards, the sample that has undergone the annealing process is immersed into a solution (HF:H$_2$O=1:124) of diluted hydrofluoric acid (DHF) for 10 seconds. Next, the sample is dried, and an aluminum oxide removal amount of the sample (hereinafter referred to as the sample of Example 1) is measured, as shown in FIG. 4.

Comparative Example 1

In Comparative Example 1, a sample (hereinafter referred to as the sample of Comparative Example 1) is provided. The sample of Comparative Example 1 includes a silicon oxide layer having a thickness of 30 Å formed on a silicon substrate and an aluminum oxide layer having a thickness of 45 Å formed on the silicon oxide layer. Then, the same steps as those for the sample of Example 1 are performed, namely, performing the annealing process, immersing into the DHF solution, and measuring an aluminum oxide removal amount of the sample of Comparative Example 1, as shown in FIG. 4.

As shown in FIG. 4, when the annealing temperature is 900° C., the aluminum oxide removal amount (about 13 Å) of the sample of Comparative Example 1 is far greater than the aluminum oxide removal amount (about 4 Å) of the sample of Example 1. In other words, compared to Comparative Example 1, the crystallization quality of aluminum oxide of Example 1 is more desirable.

Example 2

In Example 2, the sample of Example 1 (the annealing temperature of its annealing process is 950° C.) is provided. The sample of Example 1 is immersed again into the DHF solution (HF:H$_2$O=1:124) sequentially for 10 seconds, 10 seconds, 10 seconds, 30 seconds, 30 seconds, 30 seconds, and 30 seconds, and an aluminum oxide removal amount of the sample (hereinafter referred to as the sample of Example 2) is sequentially measured, as shown in FIG. 5.

Comparative Example 2

In Comparative Example 2, the sample of Comparative Example 1 (the annealing temperature of its annealing process is 950° C.) is provided. Then, the same steps as those for the sample of Example 2 are performed, namely, sequentially immersing into the DHF solution and sequentially measuring an aluminum oxide removal amount of the sample (hereinafter referred to as the sample of Comparative Example 2), as shown in FIG. 5.

As shown in FIG. 5, when the annealing temperature is 950° C., after seven-time DHF etchings, the aluminum oxide removal amount (about 45 Å) of the sample of Comparative Example 2 is far greater than the aluminum oxide removal amount (about 7 Å) of the sample of Example 2. In other words, compared to Comparative Example 2, the crystallization quality of aluminum oxide of Example 2 is more desirable. On the other hand, in Comparative Example 2, the aluminum oxide removal amount (about 13.8 Å) of the aluminum oxide layer at the bottom layer (i.e., the aluminum oxide layer close to the silicon oxide layer) is greater than the aluminum oxide removal amount (about 1.3 Å) of the aluminum oxide layer at the top layer (i.e., the aluminum oxide layer away from the silicon oxide layer). In Example 2, the aluminum oxide removal amount (about 1 Å) of the aluminum oxide layer at the bottom layer (i.e., the aluminum oxide layer close to the silicon nitride layer) is approximately equal to the aluminum oxide removal amount (about 1.8 Å) of the aluminum oxide layer at the top layer (i.e., the aluminum oxide layer away from the silicon nitride layer). In other words, compared to Comparative Example 2, the crystallization uniformity of aluminum oxide of Example 2 is more desirable. Therefore, according to the results of FIG. 4 and FIG. 5, forming the aluminum oxide layer on the silicon nitride layer leads to more desirable crystallization quality and crystallization uniformity of the aluminum oxide layer.

In summary of the above, in the memory device of the invention, the buffer oxide layer is formed on the silicon nitride layer after the silicon nitride layer is formed. The silicon nitride layer is able to improve the crystallization quality of the buffer oxide layer to lower the annealing temperature of the post-deposition annealing process and further prevent the issue of wafer bow or wafer distortion.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A memory device comprising:
   a stack layer disposed on a substrate, wherein the stack layer comprises a plurality of dielectric layers and a plurality of conductive layers stacked alternately along a first direction;
   a channel structure penetrating through the stack layer and extending to cover the top surface of the stack layer;
   a charge storage structure surrounding a sidewall of the channel structure, wherein the charge storage structure comprises a first oxide layer, a nitride layer, and a second oxide layer;
   a silicon nitride layer surrounding the conductive layers; and
   a buffer oxide layer disposed between the conductive layers and the silicon nitride layer, and the silicon nitride layer disposed between the first oxide layer and the buffer oxide layer in a second direction perpendicular to the first direction, wherein a plurality of gaps are between the dielectric layers, and the conductive layers are between the gaps and the buffer oxide layer in the second direction.

2. The memory device according to claim 1, wherein the channel structure comprises a dielectric pillar and a channel layer, and the channel layer encapsulates the dielectric pillar, and the silicon nitride layer is in direct contact with the first oxide layer in the second direction.

3. The memory device according to claim 2, wherein the channel layer comprises polycrystalline silicon.

4. The memory device according to claim 1, further comprising an epilayer disposed between the channel structure and the substrate.

5. The memory device according to claim 1, wherein the buffer oxide layer comprises a high-dielectric constant material having a dielectric constant higher than that of silicon oxide.

6. The memory device according to claim 5, wherein the high-dielectric constant material comprises aluminum oxide, hafnium oxide, or a combination thereof.

7. The memory device according to claim 1, wherein a thickness of the silicon nitride layer ranges from 20 Å to 50 Å.

8. The memory device according to claim 1, wherein the silicon nitride layer is a continuous layer and conformally fills in a space between the conductive layers and the dielectric layers.

9. The memory device according to claim 1, wherein the conductive layers comprise metal, barrier metal, polycrystalline silicon, or a combination thereof.

10. The memory device according to claim 1, wherein a sidewall of the conductive layers away from the channel structure is indented from a sidewall of the dielectric layers away from the channel structure.

11. The memory device according to claim 1, wherein the charge storage structure further extends into the substrate and is disposed between the channel structure and the substrate.

12. A method of manufacturing a memory device, comprising:
   forming a stack layer on a substrate, wherein the stack layer comprises a plurality of first materials and a plurality of second materials stacked alternately along a first direction;
   forming a plurality of openings in the stack layer, the openings exposing a portion of the substrate;
   forming a charge storage structure in each of the openings, wherein the charge storage structure comprises a first oxide layer, a nitride layer, and a second oxide layer;
   forming a channel structure in each of the openings, such that the charge storage structure surrounds a sidewall of the channel structure and extends to cover the top surface of the stack layer;
   forming a slit in the stack layer between two adjacent channel structures, the slit exposing another portion of the substrate;
   performing an etching process to remove the second materials to form a plurality of gaps between the first materials;
   forming a silicon nitride layer on the substrate, the silicon nitride layer conformally covering a surface of the gaps;
   forming a buffer oxide layer on the silicon nitride layer, wherein the silicon nitride layer is disposed between the first oxide layer and the buffer oxide layer in a second direction perpendicular to the first direction; and
   forming conductive layers in the gaps, such that the buffer oxide layer is located between the conductive layers and the silicon nitride layer, wherein the conductive layers are between the gaps and the buffer oxide layer in the second direction.

13. The method of manufacturing a memory device according to claim 12, wherein the first materials comprise silicon oxide, and the second materials comprise silicon nitride or polycrystalline silicon.

14. The method of manufacturing a memory device according to claim 12, wherein the step of forming the charge storage structure and the channel structure in each of the openings comprises:
   forming a charge storage material on the substrate, the charge storage material conformally covering a bottom surface and a sidewall of each of the openings;
   removing the charge storage material on the bottom surface of each of the openings;
   forming a first channel material on the substrate, the first channel material conformally covering the bottom surface of each of the openings and a surface of the charge storage material;

forming a dielectric pillar in each of the openings, wherein a top surface of the dielectric pillar is lower than a top surface of the stack layer; and forming a second channel material on the dielectric pillar to cover the top surface of the dielectric pillar.

15. The method of manufacturing a memory device according to claim 14, further comprising forming an epilayer before forming the first channel material on the substrate, so that the epilayer located between the first channel material and the substrate.

16. The method of manufacturing a memory device according to claim 15, wherein the first channel material comprises polycrystalline silicon, the second channel material comprises polycrystalline silicon, and the epilayer comprises epitaxial silicon.

17. The method of manufacturing a memory device according to claim 12, further comprising performing an annealing process after forming the buffer oxide layer, wherein an annealing temperature of the annealing process is lower than 1,000° C.

18. The method of manufacturing a memory device according to claim 12, wherein when the second materials comprise silicon nitride, the etching process comprises using an etching solution containing phosphoric acid and pouring the etching solution into the slit to thereby remove the second materials.

19. The method of manufacturing a memory device according to claim 12, wherein a method of forming the silicon nitride layer comprises an atomic layer deposition (ALD) process or a plasma nitridation process.

* * * * *